US010096350B2

(12) United States Patent
Walsh et al.

(10) Patent No.: US 10,096,350 B2
(45) Date of Patent: Oct. 9, 2018

(54) MEMORY ARRAY WITH FLASH AND RANDOM ACCESS MEMORY AND METHOD THEREFOR, READING DATA FROM THE FLASH MEMORY WITHOUT STORING THE DATA IN THE RANDOM ACCESS MEMORY

(71) Applicant: Medtronic, Inc.

(72) Inventors: Kevin K. Walsh, Peoria, AZ (US);
Charles R. Gordon, Phoenix, AZ (US);
Paul R. Solheim, Blaine, MN (US);
Jerry D. Reiland, Coon Rapids, MN (US); Robert D. Musto, Champlain, MN (US); Duane R. Bigelow, Gilbert, AZ (US)

(73) Assignee: Medtronic, Inc., Minneapolis, MN (US)

( * ) Notice: Subject to any disclaimer, the term of this patent is extended or adjusted under 35 U.S.C. 154(b) by 563 days.

(21) Appl. No.: 13/663,099

(22) Filed: Oct. 29, 2012

(65) Prior Publication Data
US 2013/0238840 A1 Sep. 12, 2013

Related U.S. Application Data

(60) Provisional application No. 61/607,969, filed on Mar. 7, 2012.

(51) Int. Cl.
*G06F 12/00* (2006.01)
*G11C 11/00* (2006.01)
(Continued)

(52) U.S. Cl.
CPC ............ *G11C 11/005* (2013.01); *G11C 16/10* (2013.01); *G06F 3/0601* (2013.01);
(Continued)

(58) Field of Classification Search
CPC .... G06F 3/0601; G06F 3/0646; G06F 3/0668; G06F 3/0679; G06F 3/1694
(Continued)

(56) References Cited

U.S. PATENT DOCUMENTS 4,184,207 A   1/1980 McElroy
5,343,437 A   8/1994 Johnson et al.
(Continued)

FOREIGN PATENT DOCUMENTS

CN   1833291 A   9/2006
CN   101611387 A   12/2009

OTHER PUBLICATIONS

Mamidipaka et al., "Leakage Power Estimation in SRAMs", CECS Technical Report #03-32, Center for Embedded Computer Systems, University of California, Irvine, CA Sep. 1, 2003.
(Continued)

*Primary Examiner* — Ann J Lo
*Assistant Examiner* — Chie Yew

(57) ABSTRACT

Memory array, system and method for storing data. The memory array has a flash memory array, a random access memory array coupled to the flash memory and configured to receive the data, a memory management module and a data bus. The memory management module is coupled to the random access memory array and to the flash memory array, the memory management module being configured to transfer at least a portion of the data stored in the random access memory array to the flash memory array. The data bus is coupled to the flash memory array and configured to output at least a portion of the data originally stored in the random access memory array from the flash memory array.

36 Claims, 8 Drawing Sheets

(51) Int. Cl.
  *G11C 16/10* (2006.01)
  *G06F 13/42* (2006.01)
  *G06F 3/06* (2006.01)
  *G06F 13/38* (2006.01)
  *G06F 12/02* (2006.01)
  *G06F 12/0868* (2016.01)
  *G06F 12/06* (2006.01)

(52) U.S. Cl.
  CPC .......... *G06F 3/0646* (2013.01); *G06F 3/0668* (2013.01); *G06F 3/0679* (2013.01); *G06F 12/0238* (2013.01); *G06F 12/0246* (2013.01); *G06F 12/0623* (2013.01); *G06F 12/0868* (2013.01); *G06F 13/387* (2013.01); *G06F 13/42* (2013.01); *G06F 13/4234* (2013.01)

(58) Field of Classification Search
  USPC ...... 711/103, 154, 170; 710/33, 52, 74, 120, 710/243, 310; 712/14, 225, 232; 365/189.17, 189.2, 230.09
  See application file for complete search history.

(56) References Cited

U.S. PATENT DOCUMENTS

| | | | |
|---|---|---|---|
| 5,530,828 A * | 6/1996 | Kaki et al. | 711/103 |
| 5,663,905 A | 9/1997 | Matsuo et al. | |
| 6,145,050 A * | 11/2000 | Kaki et al. | 711/103 |
| 6,200,265 B1 | 3/2001 | Walsh et al. | |
| 6,418,506 B1 | 7/2002 | Pashley et al. | |
| 6,462,766 B1 | 10/2002 | Roeber et al. | |
| 6,532,500 B1 * | 3/2003 | Li | G06F 3/0604 710/15 |
| 6,539,438 B1 | 3/2003 | Ledzius et al. | |
| 6,551,276 B1 | 4/2003 | Mann et al. | |
| 6,788,609 B2 * | 9/2004 | Yamagami | G06F 3/0601 365/185.11 |
| 6,799,030 B2 | 9/2004 | Barber et al. | |
| 6,981,070 B1 * | 12/2005 | Luk | G06F 3/0617 707/999.2 |
| 7,057,911 B2 * | 6/2006 | Klint | G06F 13/1694 365/189.17 |
| 7,193,512 B1 | 3/2007 | Coulthard | |
| 7,647,562 B2 | 1/2010 | Ghercioiu et al. | |
| 7,684,262 B2 | 3/2010 | Zampaglione et al. | |
| 7,692,964 B1 | 4/2010 | Sabharwal et al. | |
| 7,704,227 B2 | 4/2010 | Moberg et al. | |
| 7,835,179 B1 | 11/2010 | Prabhakar | |
| 7,876,124 B2 * | 1/2011 | Okyay | H03L 7/06 326/38 |
| 7,939,021 B2 | 5/2011 | Smith et al. | |
| 7,941,682 B2 | 5/2011 | Adams | |
| 7,945,825 B2 * | 5/2011 | Cohen | G06F 11/1072 714/721 |
| 9,030,894 B2 * | 5/2015 | Roy | G11C 7/1075 365/189.17 |
| 2002/0147882 A1 * | 10/2002 | Pua | G06F 3/0607 711/103 |
| 2004/0133120 A1 | 7/2004 | Frie et al. | |
| 2004/0133248 A1 | 7/2004 | Frei et al. | |
| 2004/0133390 A1 | 7/2004 | Osorio et al. | |
| 2004/0138518 A1 | 7/2004 | Rise et al. | |
| 2004/0138581 A1 | 7/2004 | Frei et al. | |
| 2004/0138711 A1 | 7/2004 | Osorio et al. | |
| 2004/0167653 A1 * | 8/2004 | Kaki et al. | 700/103 |
| 2005/0050261 A1 | 3/2005 | Roehr et al. | |
| 2005/0245904 A1 | 11/2005 | Estes et al. | |
| 2006/0027644 A1 * | 2/2006 | Takashi | G06F 3/0613 235/380 |
| 2006/0138245 A1 | 6/2006 | Lee | |
| 2006/0173406 A1 | 8/2006 | Hayes et al. | |
| 2006/0239097 A1 | 10/2006 | Nakai et al. | |
| 2007/0016170 A1 | 1/2007 | Kovelman | |
| 2007/0255889 A1 * | 11/2007 | Yogev | G06F 12/0246 711/103 |
| 2007/0294496 A1 * | 12/2007 | Goss | G06F 12/1408 711/163 |
| 2008/0016260 A1 * | 1/2008 | Pennock | G06F 13/1615 710/52 |
| 2008/0297365 A1 | 12/2008 | Welles et al. | |
| 2008/0310337 A1 | 12/2008 | Welles | |
| 2009/0016251 A1 | 1/2009 | Adams et al. | |
| 2009/0024819 A1 * | 1/2009 | Fisher et al. | 711/170 |
| 2009/0088731 A1 | 4/2009 | Campbell et al. | |
| 2009/0098901 A1 * | 4/2009 | Norman | G06F 12/0238 455/550.1 |
| 2009/0154242 A1 * | 6/2009 | Janai | G11C 29/70 365/185.09 |
| 2009/0163855 A1 | 6/2009 | Shin et al. | |
| 2009/0228631 A1 * | 9/2009 | Marulkar | G06F 13/1605 711/100 |
| 2010/0146193 A1 * | 6/2010 | Jang | G06F 12/0868 711/103 |
| 2010/0220543 A1 * | 9/2010 | Norman | G06F 12/06 365/230.06 |
| 2011/0098638 A1 | 4/2011 | Chawla et al. | |
| 2011/0098674 A1 | 4/2011 | Vicente et al. | |
| 2012/0096215 A1 * | 4/2012 | Zhang | G06F 12/0246 711/103 |
| 2012/0212646 A1 * | 8/2012 | Norman | H04N 1/2166 348/231.2 |
| 2012/0239858 A1 * | 9/2012 | Melik-Martirosian | G11C 16/349 711/103 |
| 2012/0246392 A1 * | 9/2012 | Cheon | G06F 12/0871 711/103 |
| 2013/0124932 A1 * | 5/2013 | Schuh | G06F 9/44 714/718 |
| 2015/0074344 A1 | 3/2015 | Fisher et al. | |

OTHER PUBLICATIONS

Qin et al., "SRAM Leakage Suppression by Minimizing Standby Supply Voltage", Power Point Presentation, Berkley Wireless Research Center, ISQED 2004, pp. 1-19.
(PCT/US2013/028513) PCT Notification of Transmittal of the International Search Report and the Written Opinion of the International Searching Authority, dated Jun. 20, 2013, 11 pages.
Chinese Office Action, Application No. 201380013116.2, dated Jun. 1, 2016, Chinese language, 7 pages.
Chinese Office Action, Application No. 201380013116.2, dated Jun. 1, 2016, English translation, 5 pages.

* cited by examiner

MEMORY ARRAY WITH FLASH AND RANDOM ACCESS MEMORY AND METHOD THEREFOR, READING DATA FROM THE FLASH MEMORY WITHOUT STORING THE DATA IN THE RANDOM ACCESS MEMORY

FIELD

The present invention relates generally to an electronic memory array, systems and method therefor, and, more particularly, to an electronic memory array having both a flash memory array and a random access memory array.

BACKGROUND

Various forms and formats of electronic data storage are known in the art. Most such forms currently in use are configured to receive electronic data from an outside source, preserve the electronic data for a time, and output the electronic data on command. Over the development of such electronic storage techniques, storage capacity and reliability has tended to steadily increase while cost has decreased.

However, while cost, reliability and capacity have improved over time for most formats, various formats continue to provide benefits over other formats while suffering various detriments. For instance, while volatile memory technologies, such as random access memory, or "RAM", is relatively fast and inexpensive, the random access memory module must remain powered on in order to preserve the electronic data stored therein. This makes random access memory relatively expensive to operate and unreliable in the event of power disruptions. Consequently, random access memory technology, such as static random access memory, is typically utilized only for short-term storage to facilitate the rapid transfer of data for near-term use by electronic components.

Non-volatile memory such as flash memory, by contrast, may preserve electronic data stored therein for extended periods of time without a need to maintain power to the flash memory module. However, flash memory typically requires a relatively complex interface.

SUMMARY

In the past, memory arrays have not tended to incorporate combinations of different types of electronic data storage technologies. Various technologies incorporate different requirements for operation. Certain technologies require different voltage supplies, different time to read from and write to the memory cells, and different addressing schemes. For instance, flash memory is typically written to in predetermined blocks of data, so that to whatever extent an amount of data is not the size of the predetermined block, writing to the flash array may waste system resources. Consequently, there have been few, if any, perceived benefits from combining different technologies in a single array.

However, a memory array has been developed which incorporates static random access memory and flash memory in a single memory array. The memory array incorporates a memory management module which is configured to interface between the random access memory and the flash memory. In particular, the memory management module is configured to write new electronic data to the random access memory array until such time as a condition is met to write the electronic data from the random access memory to the flash memory. The memory management module may further be configured to manage the reading of electronic data from the memory array, identifying where between the random access memory and the flash memory data is stored and providing the data on an output bus. As a result, the various differences between flash memory and random access memory may be managed while providing the benefits of both flash memory and random access memory.

In an embodiment, a memory array for storing data comprises a flash memory array, a random access memory array operatively coupled to the flash memory and configured to receive the data, a memory management module and an address/data bus. The memory management module is operatively coupled to the random access memory array and to the flash memory array, the memory management module being configured to transfer at least a portion of the data stored in the random access memory array to the flash memory array. The address/data bus is operatively coupled to the flash memory array and configured to output at least a portion of the data originally stored in the random access memory array from the flash memory array.

In an embodiment, the random access memory array comprises a static random access memory array.

In an embodiment, the flash memory array comprises a plurality of sectors, at least one of the plurality of sectors having a data storage capacity and wherein the memory management module is configured to transfer the portion of the data from the random access memory array to the flash memory array when the at least a portion of the data stored in the random access memory array equals the data storage capacity of the at least one of the plurality of sectors.

In an embodiment, the at least a portion of the data corresponds to an event and wherein the memory management module is configured to transfer the portion of the data from the random access memory array to the flash memory array when all of the portion of the data corresponding to the event is stored in the random access memory array.

In an embodiment, the event is a completion of storage of a predetermined block of data in the random access memory.

In an embodiment, the flash memory array comprises a plurality of sectors, at least one of the plurality of sectors having a data storage capacity.

In an embodiment, an amount of data of the predetermined block of data is less than the data storage capacity of the at least one of the plurality of sectors.

In an embodiment, the amount of data of the predetermined block of data is greater than the data storage capacity of the at least one of the plurality of sectors.

In an embodiment, the memory management module is configured to transfer, from the random access memory to the flash memory, a portion of the predetermined block of data equal to the data storage capacity of the at least one of the plurality of sectors.

In an embodiment, a plurality of the predetermined blocks of data corresponding to a plurality of storage events are stored in the random access memory, and wherein the memory management module is configured to transfer, from the random access memory to the flash memory, the plurality of the predetermined blocks of data to the flash memory when an amount of the data of the plurality of predetermined blocks of data is at least the data capacity of the at least one of plurality of sectors.

In an embodiment, a system comprises a memory array for storing data and a controller. The memory array comprises a flash memory array, a random access memory array operatively coupled to the flash memory and configured to receive the data, a memory management module and an address/data bus. The memory management module is operatively coupled to the random access memory array and to the flash memory array, the memory management module being configured to transfer at least a portion of the data stored in the random access memory array to the flash memory array. The address/data bus is operatively coupled to the flash memory array and configured to output at least a portion of the data originally stored in the random access memory array from the flash memory array. The controller is operatively coupled to the memory array and having firmware configured to control, at least in part, the memory array.

In an embodiment, a method of storing data in a memory array comprises the steps of receiving the data in a random access memory array, transferring at least a portion of the data stored in the random access memory array to a flash memory array, and outputting on a address/data bus at least a portion of the data originally stored in the random access memory array from the flash memory array.

In an embodiment, the flash memory array comprises a plurality of sectors, at least one of the plurality of sectors having a data storage capacity, and the transferring the portion of the data from the random access memory array to the flash memory array step occurs when the at least a portion of the data stored in the random access memory array equals the data storage capacity of the at least one of the plurality of sectors.

In an embodiment, the at least a portion of the data corresponds to an event, and the transferring the portion of the data from the random access memory array to the flash memory array step occurs when all of the portion of the data corresponding to the event is stored in the random access memory array.

In an embodiment, the transferring step transfers, from the random access memory to the flash memory, a portion of the predetermined block of data equal to the data storage capacity of the at least one of the plurality of sectors.

In an embodiment, a plurality of the predetermined blocks of data corresponding to a plurality of storage events are stored in the random access memory, and the transferring step transfers, from the random access memory to the flash memory, the plurality of the predetermined blocks of data to the flash memory when an amount of the data of the plurality of predetermined blocks of data is at least the data capacity of the at least one of plurality of sectors.

FIGURES

DESCRIPTION

Figure 1:
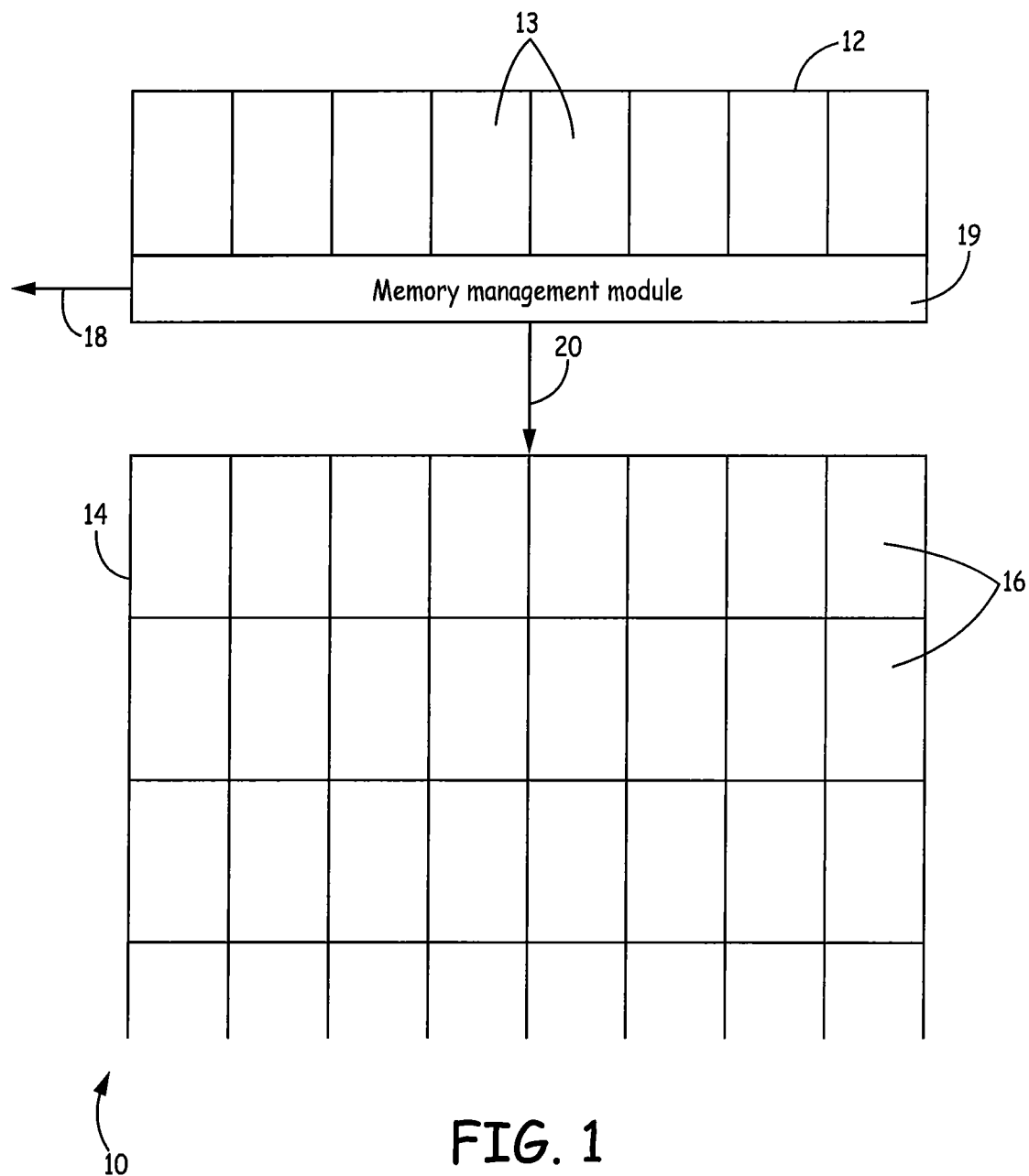
FIG. 1 is a block diagram of a memory array.

FIG. 1 is a block diagram of memory array 10. Memory array 10 includes random access memory array 12 and flash array 14. In an embodiment, random access memory array 12 is a static random access memory array, as known in the art. In alternative embodiments, random access memory array 12 is any random access memory array known in the art, or any volatile memory array known in the art. In an embodiment, flash array 14 is a NOR flash array and, in an embodiment, the particular NOR array has a voltage requirement that approximately matches the voltage requirement of random access memory array 12. In various embodiments, flash array 14 is any flash memory known in the art, or any non-volatile memory known in the art which can be both read and written to. In the illustrated embodiment, random access memory array 12 has a capacity of forty-eight (48) kilobytes in ninety-six (96) 512 byte blocks 13. In an embodiment, flash array 14 has a capacity of one (1) megabyte divided into a plurality of sectors 16, at least one of which has a data storage capacity. In alternative embodiments, random access memory array 12 and flash array 14 each have sizes as appropriate to the applications to which they are applied. In various such embodiments, the size of random access memory array 12 and flash array 14 may generally be of any size, for example, random access memory could be kilobyte-size, megabyte-size or gigabyte-size or larger. In an embodiment, the transfer of one 512 byte block 13 of data from random access memory array 12 to flash array 14 takes approximately twenty-five (25) milliseconds. Output address/data bus 18 provides data stored in memory array 10 to a user of the data outside of memory array 10.

Memory management module 19 is coupled to random access memory array 12 and intra-array bus 20. Memory management module 19 is configured as a block mover to manage movement of data from random access memory array 12 to flash array 14 via intra-array bus 20. Memory management module 19 is configured to assess, at least in part, if and when one or more conditions are met for transferring data from random access memory array 12 to flash array 14.

In an embodiment, memory management module 19 is configured to transfer blocks of predetermined size from random access memory array 12 to flash array 14 by way of intra-array bus 20. It is a characteristic of common types of flash memory, in various embodiments including those of flash array 14, that in order to write to any one memory cell of the flash array, all of the cells of the sector 16 of flash array 14 of which the particular cell is a part must be activated together, whether with actual data or dummy data. In an embodiment, memory management module 19 is configured to transfer an amount of data from random access memory array 12 in amounts which are even multiples of the predetermined sector size each sector 16 of flash array 14. In an embodiment, the size blocks 13 of random access memory array 12 is selected to be the same size as the predetermined sector size of sectors 16 of flash array 14. In the exemplary embodiment above, both random access memory array 12 and flash array 14 have sector 16 and block 13 sizes of 512 bytes.

Figure 2:
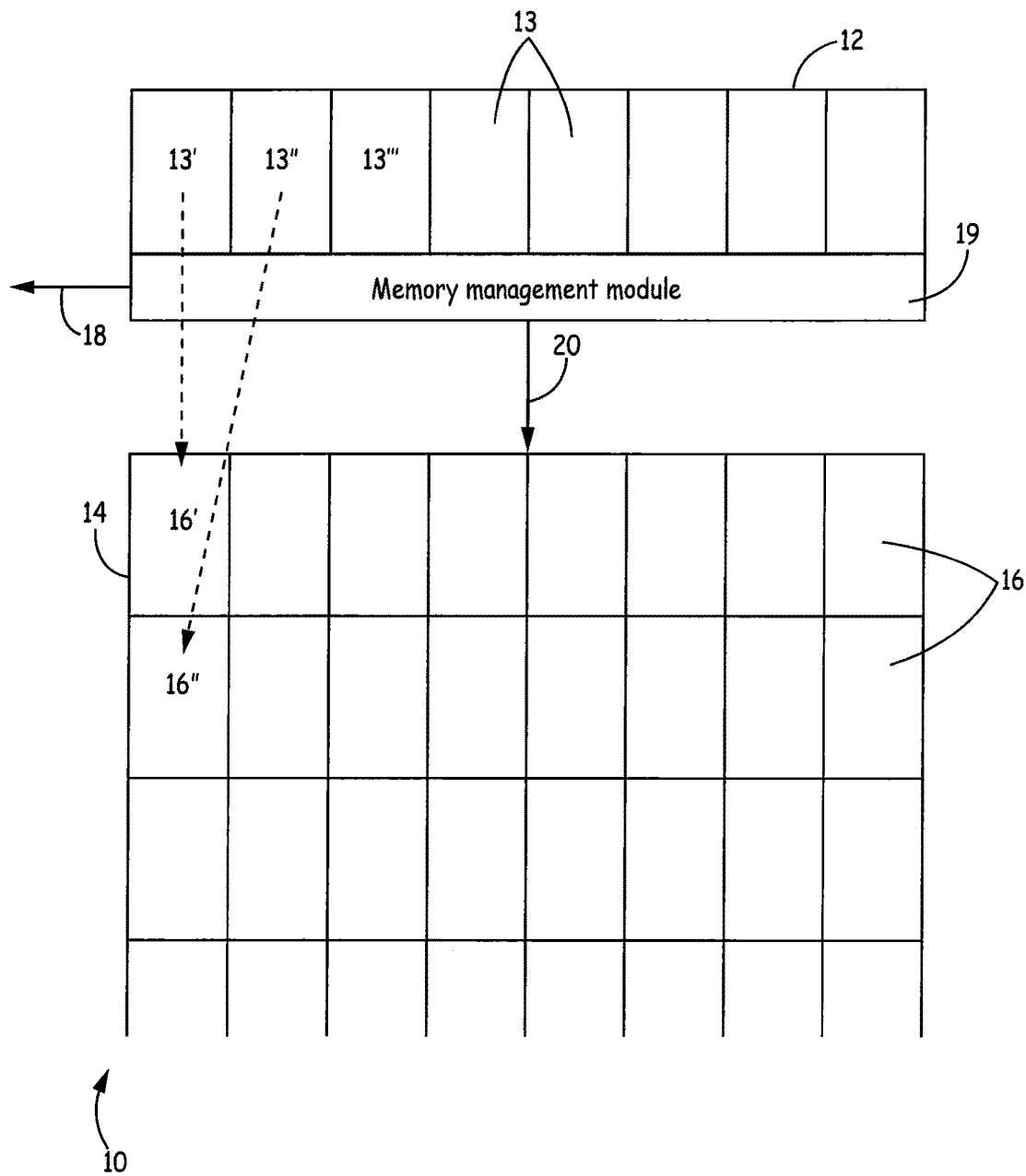
FIG. 2 is an illustration of data transfer in the memory array of FIG. 1.

FIG. 2 is a simplified illustration of the transfer of blocks 13 of data from random access memory array 12 to sectors 16 of flash array 14. In some embodiments, memory management module 19 is configured to monitor a status of random access memory array 12. When at least one block 13 of random access memory array 12 is filled with data, the complete block 13 is transferred by memory management module 19 to flash array 14. Flash array 14 activates a complete sector 16 for writing, with one sector 16 activated for every block 13 to be written from random access memory array 12 to flash array 14. To the extent that random access memory array 12 has data that does not completely fill a block 13, the excess data is not transferred from random access memory array 12 until the block 13 is filled.

In the illustrated embodiment, blocks 13' and 13" are fully utilized while block 13''' is only partially utilized. Memory management module 19 assess the status of random access memory array 12 and, based on the status of blocks 13', 13" and 13''', initiates transfer of the data in blocks 13' and 13" to sectors 16' and 16" of flash array 14. In particular, memory management module 19 instructs flash array to enable sectors 16' and 16" for writing and instructs random access memory array 12 to place the data stored in blocks 13' and 13" on bus 20. Flash array 14 receives the data from blocks 13' and 13" and writes the data to blocks 16' and 16", respectively. Random access memory array 12 does not place the data in block 13''' on bus 20 and flash array 14 does not activate any sector 16 to receive the data of block 13'''. After the data in blocks 13' and 13" are placed on bus 20, random access memory array may make blocks 13' and 13" available to receive new data.

In such embodiments, the data in block 13''' may remain in block 13''' until new data is written to random access memory array 12. In such circumstances, the new data may be written to block 13''' until block 13''' is full, upon which block 13''' may be transferred to a sector 16 of flash array 14. In such circumstances, block 13''' effectively acts as temporary storage or a "scratch pad" for fragments of data from larger discrete data groups. In the illustrated embodiment, block 13''' is utilized as the scratch pad. Alternatively, a dedicated block 13, whether a conventional part of blocks 13 of random access memory array 12 or a dedicated block 13 part of random access memory array 12 or located elsewhere in memory array 10 may be utilized as the scratch pad for collecting enough data to write a complete sector 16.

In an alternative embodiment, data is not written from random access memory array 12 to flash array until and unless all blocks 13 of random access memory array 12 are full. In such embodiments, transfer of data into random access memory array 12 may be temporary halted when random access memory array 12 has been filled. Transfer of data to random access memory array 12 may resume once space has been cleared in random access memory array 12 by transferring at least some of the data in random access memory array 12 to flash array 14.

In various alternative embodiments, the size of blocks 13 of random access memory 12 and the size of sectors 16 of flash array 14 are not equivalent. However, in such embodiments, memory management module 19 is configured to base transfer of data from random access memory 12 to flash array 14 on the accumulation of data equivalent to the data storage capacity of sectors 16 of flash array 14. While having equal size blocks 13 and sectors 16 may provide for simplicity in managing data transfer, memory management module 19 does not require equivalent size blocks 13 and sectors 16 to be of equal size.

Figure 3:
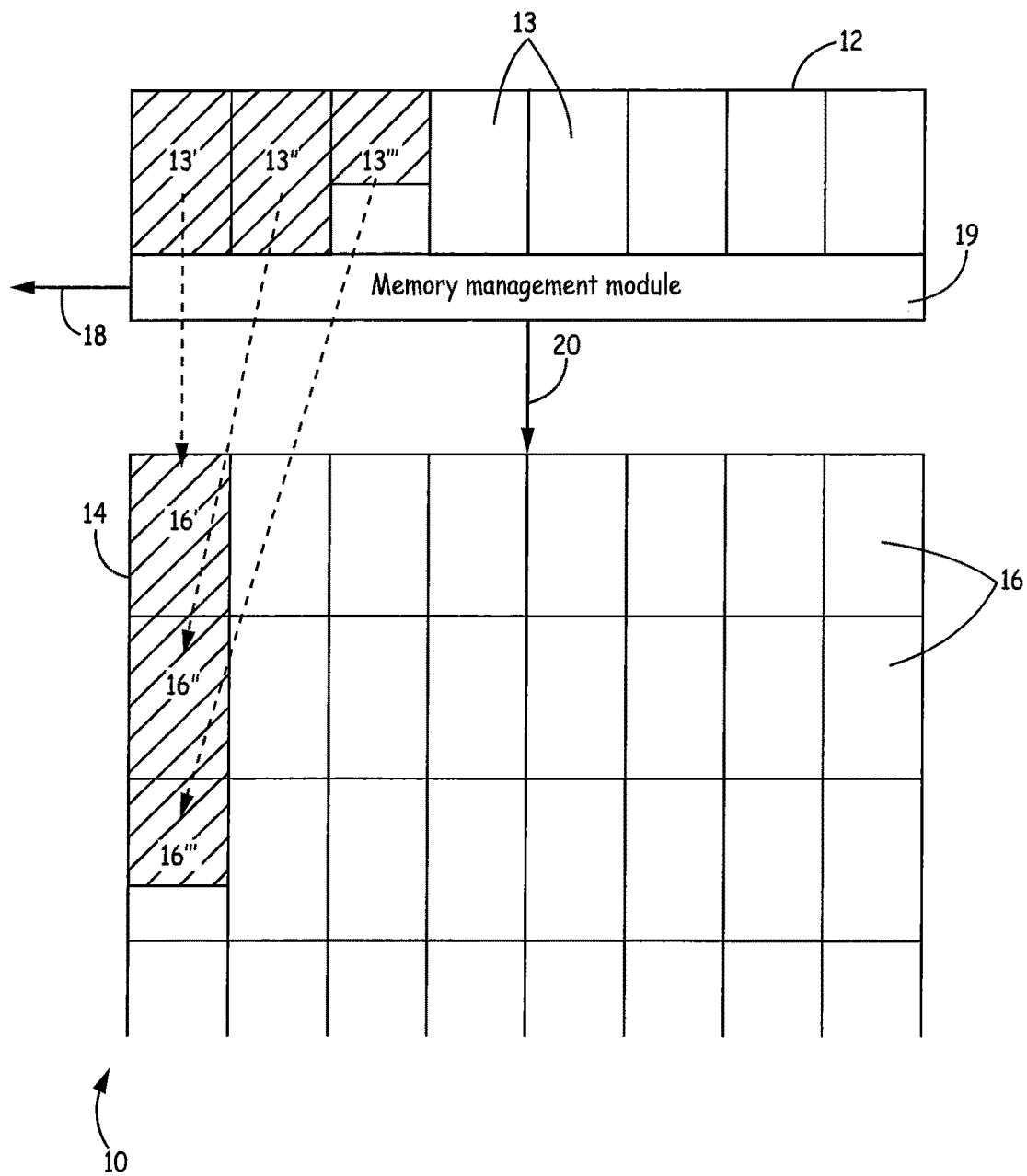
FIG. 3 is an illustration of data transfer in the memory array of FIG. 1.

FIG. 3 is a simplified illustration of an alternative method of transferring data from random access memory array 12 to flash array 14. In the alternative method, memory management module 19 does not base data transfer from random access memory array 12 to flash array 14 on the basis of writing complete sectors 16 of flash array 14, but rather on the basis of the nature of the data stored in random access memory array 12. In certain circumstances, the data written to memory array 10 may be of particular, discrete events. In an exemplary circumstance, memory array 10 may be utilized to store medical data. Such medical data may be related to medical events, such as a cardiac episode experienced by a patient. In alternative circumstances, such as automotive applications, data related to an event such as a maintenance check or a crash may be collected and stored.

In such circumstances, memory management module 19 may base transferring data from random access memory array 12 to flash array 14 on the completion of the event and the storage of event data in random access memory 12. Data from the event is first completely stored in random access memory array 12, filling in blocks 13' and 13", and partially filling block 13'''. When data related to the event indicates that all of the event data has been stored in random access memory array 12, memory management module 19 initiates transfer of all or essentially all of the event data to flash array 14, filling blocks 16' and 16", and partially filling block 16'''. As such, the transfer of all or essentially all of the event data to flash array 14 may be without respect to the complete filling of sectors 16 of flash array 14. Consequently, in contrast to the method illustrated in FIG. 2, while sectors 16 may be filled to the extent possible, not all sectors 16 of flash array 14 are necessarily filled at the time of writing the event data, and memory management module 19 does not necessarily base data transfer decision on writing full sectors 16. In such embodiments, to preserve the effective life of flash array 14, the sectors 16 which are not completely filled should not be written to again until either the additional capacity of the sector 16 is needed or the sector 16 is rewritten in its entirety.

Figure 4:
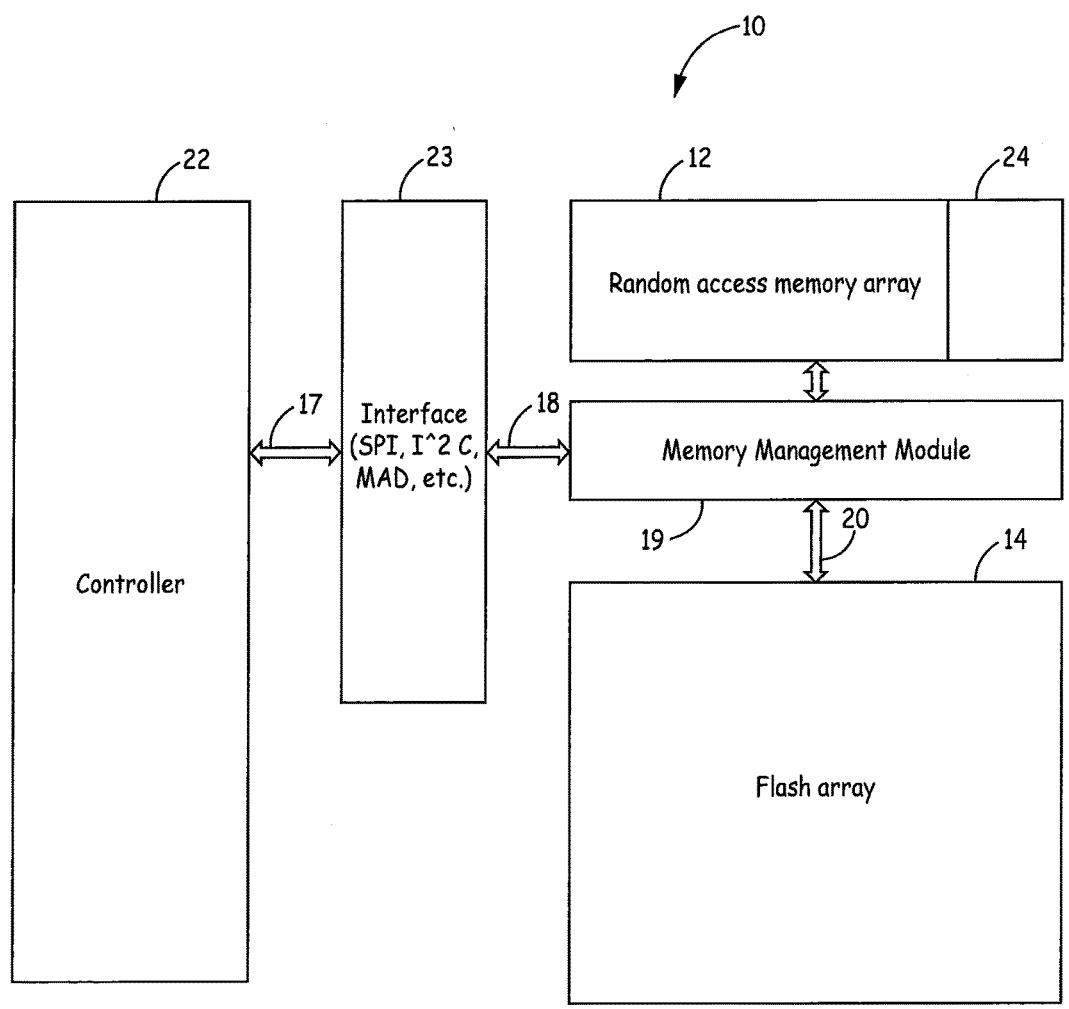
FIG. 4 is a system incorporating the memory array of FIG. 1.

FIG. 4 is a block diagram of an implementation of a system incorporating memory array 10. Controller 22 is selectable from various controllers as known in the art, including off-the-shelf microprocessors and propriety designs. Controller 22 is operatively coupled to memory management module of memory array 10 through interface module 23 via address/data bus 17 and address/data bus 18. Address/data bus 18 is configured to transmit data from controller 22 or a source controlled by controller 22 to memory management module 19. Address/data bus 18 is further configured to control, at least in part, the operation of memory array 10 by commanding the reading of data at least from flash array 14 and the performance of memory management module 19. Address/data bus 18 is bi-directional to permit memory management module 19 to transmit information to controller 22. Interface module 23 is conventional and serves to facilitate addressing/data interface. Examples of standard units that can be used as interface module 23 include, but are not limited to, SPI, I$^2$C and MAD.

Controller 22 may be configured to exert various forms of control over the performance of memory array 10 utilizing software or firmware applications. In an embodiment, controller 22 is configured to transmit data to memory array 10 to be written to flash array 14. In an embodiment, controller 22 is configured with a map of what data is stored in memory array 10 and an ability to command the reading of data stored in flash array 14. In an embodiment, controller 22 includes an address register of where the data is stored in memory array 10, and the ability to command the reading of data from memory array 10 on the basis of writing out data from particular addresses. In various embodiments, memory management module 19 provides the address register to controller 22.

A portion of random access memory 12 is utilized as a scratchpad 24. In a first step, data is stored in memory array 10 by first transferring data from controller 22 via address/data bus 17 through interface module 23 and address/data bus 18 to memory management module 19 and then on to random access memory array 12. The location the data is stored in random access memory array 12 may be controlled by controller 22 or by memory management module 19. In an optional second step, data retained in flash and subsequently in memory management module 19 is moved to scratchpad 24. The location of the data that is retained may be determined by controller 22 or memory management module 19. In a third step, data in random access memory array 12 is appended to data in scratchpad 24. In a fourth step, the combined data may be moved from scratchpad 24 to memory management module 19 and subsequently to flash memory 14 as described. As data is moved from flash memory array 14 to scratchpad 24, the location or location in flash memory array may be written over as needed and then the data contained in scratchpad may be written back to flash memory array 12.

In a further embodiment, controller 22 is configured to manage, at least in part, the event-driven transfer of data from random access memory array 12 to flash array 14 as illustrated in FIG. 3. In such an embodiment, memory management module 19 is not necessarily configured to determine when all data relating to an event has been stored in random access memory 12, and instead relies on a command from controller 22 to transfer data related to the event stored in random access memory 12 to flash array 14. Similarly, controller 22 may be configured to command the reading out of all of the event data from flash array 14, in various embodiments by tracking the memory addresses of the event data in flash array 14.

In the embodiments described above, controller 22 is configured to read data only from flash array 14. In such embodiments, data stored in random access memory array 12 is not accessible to be written out of memory array 10 until and unless it has first been written to flash array 14. Such embodiments provide for greater simplicity of design while having the disadvantage of data stored in random access memory array 12 being at least temporarily inaccessible. However, in other embodiments, data stored in random access memory array 10 is directly accessible via data bus 20 without first being written to flash array 14. In an embodiment, address/data bus 18 is further configured to transmit data stored in random access memory array 12 without the data stored in random access memory array 12 first having to be stored in flash array 14 and transmitted on output bus 18.

Figure 5:
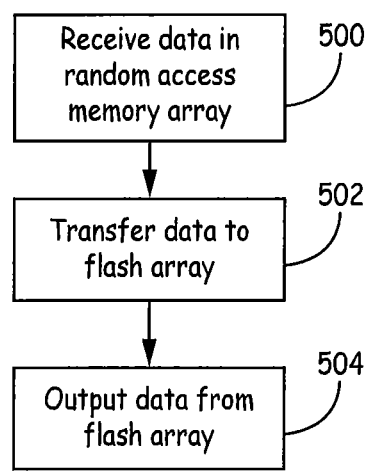
FIG. 5 is a flow chart for storing data in a memory array.

FIG. 5 is a flow chart for storing data in memory array 10. Data is received (500) in random access memory array 12. At least a portion of the data received in random access memory array 12 is transferred (502) to flash array 14. As discussed in detail above, in various embodiments the transfer from random access memory array 12 to flash array 14 may occur on the basis of at least a portion of the data stored in random access memory array 12 equals or exceeds a data storage capacity of at least one of sector 16, when data corresponding to an event has been stored in random access memory array 12, or, in an embodiment, when the data stored in random access memory array 12 is less than the data storage capacity of at least one of sector 16. At least a portion of the data originally stored in random access memory array 12 is outputted (504) on output address/data bus 18 from flash array 14.

Figure 6:
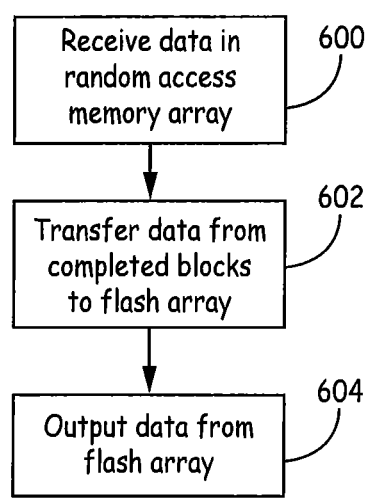
FIG. 6 is a flow chart for storing data in a memory array as in FIG. 2.

FIG. 6 is a flow chart for storing data in memory array 10 by transferring completed blocks 13 as illustrated in FIG. 2. Data is received (600) in random access memory array 12. Data in completed cells 13, such as cells 13' and 13" in the embodiment illustrated above, is transferred (602) to flash array 14. Data in incomplete cells 13, such as cell 13''' in the embodiment illustrated above, is not transferred to flash array 14. At least a portion of the data originally stored in random access memory array 12 is outputted (604) on output address/data bus 18.

Figure 7:
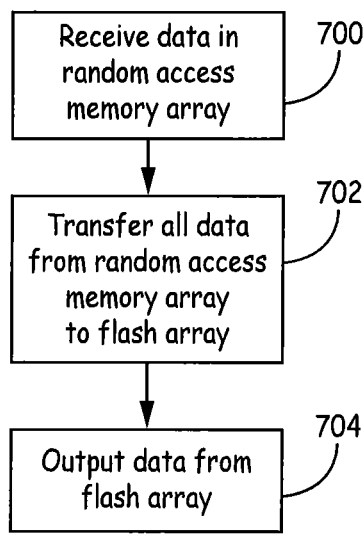
FIG. 7 is a flow chart for storing data in a memory array as in FIG. 3.

FIG. 7 is a flow chart for storing data in memory array 10 by transferring complete and incomplete blocks 13 as illustrated in FIG. 3. Data is received (700) in random access memory array 12. In an embodiment, all data in random access memory array 12, whether in completed cells 13, such as cells 13' and 13", or incomplete cell 13, such as cell 13''' in the embodiment illustrated above, is transferred (702) to flash array 14. In an embodiment, all data in random access memory 12 pertaining to a particular event is transferred (702), regardless of whether cells 13 in which the data relating to a particular event or file are complete or incomplete. At least a portion of the data originally stored in random access memory array 12 is outputted (704) on output address/data bus 18.

Figure 8:
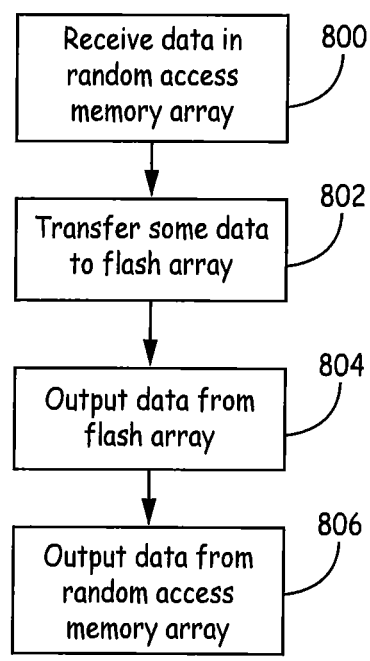
FIG. 8 is a flow chart for storing data in a memory array and outputting data from both a flash array and a random access memory array of the memory array.

FIG. 8 is a flow chart for storing data in memory array 10 and outputting data from either or both random access memory array 12 and flash array 14. Data is received (800) in random access memory array 12. At least a portion of the data received in random access memory array 12 is transferred (802) to flash array 14, in various embodiments according to the various requirements and techniques described above. At least a portion of the data originally stored in random access memory array 12 is outputted (804) on output address/data bus 18. At least a portion of the data stored in random access memory array 12 is outputted (806) on address/data bus 18.

It is contemplated that a device into which memory array 10 may be utilized, e.g., an implantable medical device, may have other functions which are not necessarily directly related to the storage and/or retrieval of data to and/or from memory array 10. As an example, such an implantable medical device may be involved in tasks which either demands a relatively high power requirement or demands a relatively high processor usage, or both. Transmitting information by telemetry to and/or from an external device may be such an event. If memory array is involved in moving data, e.g., to and/or from flash memory array 14 and/or to and/or from random access memory array, it may be desirable to interrupt, suspend or pause such memory events so that the higher priority and/or high resource usage event may be taken care of by either without also using resources, e.g., power, on memory operations, or without requiring the higher priority and/or high resource usage event to wait for the completion of the memory event. In such case, it is contemplated that controller 22 could issue a pause command, essentially stopping memory operations until another event or events can be taken care of or controller 22 could issue an abort command causing memory 10 to stop and abort the memory operation currently underway. In this case, memory array 10 could then either stop as soon as possible at a data safe stopping point or revert to a previous memory state.

In an embodiment, memory array 10 may develop a fault condition or other condition with which memory array 10 itself is unable to resolve. In such circumstance, memory array 10 may issue a request to controller 22 from assistance in resolving the fault condition or other condition and controller 22 may assist memory array 10 in doing so.

Thus, embodiments of a memory module and method are disclosed. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A memory array for storing data, comprising:
a flash memory array;
a random access memory array operatively coupled to said flash memory, said random access memory and said flash memory configured to receive said data;
a memory management module operatively coupled to said random access memory array and to said flash memory array, said memory management module being configured to transfer at least a portion of said data stored in said random access memory array to said flash memory array; and
a data bus operatively coupled to said flash memory array and configured to output directly said at least a portion of said data in said flash memory array without again storing said output in said random access memory array,
wherein said memory management module is configured to receive, from an external controller operatively coupled to said memory array and having firmware configured to control, at least in part, said memory array, an interrupt command generated in response to a detected operation of an implantable medical device.

2. The memory array of claim 1 wherein said random access memory array comprises a static random access memory array.

3. The memory array of claim 1 wherein said flash memory array comprises a plurality of sectors, at least one of said plurality of sectors having a data storage capacity and wherein said memory management module is configured to transfer said at least a portion of said data from said random access memory array to said flash memory array when said at least a portion of said data stored in said random access memory array equals said data storage capacity of said at least one of said plurality of sectors.

4. The memory array of claim 1 wherein said at least a portion of said data corresponds to an event and wherein said memory management module is configured to transfer said at least a portion of said data from said random access memory array to said flash memory array when all of said at least a portion of said data corresponding to said event is stored in said random access memory array.

5. The memory array of claim 4 wherein said event is a completion of storage of a predetermined block of data in said random access memory.

6. The memory array of claim 5 wherein said flash memory array comprises a plurality of sectors, at least one of said plurality of sectors having a data storage capacity.

7. The memory array of claim 6 wherein an amount of data of said predetermined block of data is less than said data storage capacity of said at least one of said plurality of sectors.

8. The memory array of claim 6 wherein an amount of data of said predetermined block of data exceeds said data storage capacity of said at least one of said plurality of sectors.

9. The memory array of claim 8 wherein said memory management module is configured to transfer, from said random access memory to said flash memory, a portion of said predetermined block of data equal to said data storage capacity of said at least one of said plurality of sectors.

10. The memory array of claim 6 wherein a plurality of said predetermined blocks of data corresponding to a plurality of storage events are stored in said random access memory, and wherein said memory management module is configured to transfer, from said random access memory to said flash memory, said plurality of said predetermined blocks of data to said flash memory when an amount of said data of said plurality of predetermined blocks of data is at least said data capacity of said at least one of plurality of sectors.

11. A system, comprising:
a memory array for storing data, comprising:
a flash memory array;
a random access memory array operatively coupled to said flash memory, said random access memory and said flash memory configured to receive said data;
a memory management module operatively coupled to said random access memory array and to said flash memory array, said memory management module being configured to transfer at least a portion of said data stored in said random access memory array to said flash memory array; and
a data bus operatively coupled to said flash memory array and configured to output directly said at least a portion of said data in said flash memory array without again storing said output in said random access memory array; and
an external controller operatively coupled to said memory array and having firmware configured to control, at least in part, said memory array, wherein said external controller is configured to:
detect an operation of an implantable medical device; and
upon detecting said operation of the implantable medical device, issue an interrupt command to said memory management module.

12. The system of claim 11 wherein said random access memory array comprises a static random access memory array.

13. The system of claim 11 wherein said flash memory array comprises a plurality of sectors, at least one of said plurality of sectors having a data storage capacity and wherein said memory management module is configured to transfer said at least a portion of said data from said random access memory array to said flash memory array when said at least a portion of said data stored in said random access memory array equals said data storage capacity of said at least one of said plurality of sectors.

14. The system of claim 11 wherein said at least a portion of said data corresponds to an event and wherein said memory management module is configured to transfer said at least a portion of said data from said random access memory array to said flash memory array when all of said at least a portion of said data corresponding to said event is stored in said random access memory array.

15. The system of claim 14 wherein said event is a completion of storage of a predetermined block of data in said random access memory.

16. The system of claim 15 wherein said flash memory array comprises a plurality of sectors, at least one of said plurality of sectors having a data storage capacity.

17. The system of claim 16 wherein an amount of data of said predetermined block of data is less than said data storage capacity of said at least one of said plurality of sectors.

18. The system of claim 16 wherein an amount of data of said predetermined block of data exceeds said data storage capacity of said at least one of said plurality of sectors.

19. The system of claim 18 wherein said memory management module is configured to transfer, from said random access memory to said flash memory, a portion of said predetermined block of data equal to said data storage capacity of said at least one of said plurality of sectors.

20. The system of claim 16 wherein a plurality of said predetermined blocks of data corresponding to a plurality of storage events are stored in said random access memory, and wherein said memory management module is configured to transfer, from said random access memory to said flash memory, said plurality of said predetermined blocks of data to said flash memory when an amount of said data of said plurality of predetermined blocks of data is at least said data capacity of said at least one of plurality of sectors.

21. The system of claim 11, wherein said interrupt command is a pause command, and wherein said memory management module is configured to pause at least one of said transfer or said output in response to said pause command received from said external controller.

22. The system of claim 11, wherein said interrupt command is an abort command, wherein said memory management module is configured to abort at least one of said transfer or said output in response to said abort command received from said external controller.

23. The system of claim 11 wherein, in the event of a fault condition, said memory management module is configured to issue a request for assistance in resolving said fault condition from said external controller.

24. A method of storing data in a memory array, comprising:
receiving said data in a random access memory array;
transferring at least a portion of said data stored in said random access memory array to a flash memory array;
outputting directly on a data bus said at least a portion of said data in said flash memory array without again storing said output in said random access memory array; and
receiving, from an external controller operatively coupled to said memory array and having firmware configured to control, at least in part, said memory array, an interrupt command, said interrupt command generated in response to a detected operation of an implantable medical device.

25. The method of claim 24:
wherein said flash memory array comprises a plurality of sectors, at least one of said plurality of sectors having a data storage capacity; and
wherein said transferring said at least a portion of said data from said random access memory array to said flash memory array step occurs when said at least a portion of said data stored in said random access memory array equals said data storage capacity of said at least one of said plurality of sectors.

26. The method of claim 24:
wherein said at least a portion of said data corresponds to an event; and
wherein said transferring said at least a portion of said data from said random access memory array to said flash memory array step occurs when all of said at least a portion of said data corresponding to said event is stored in said random access memory array.

27. The method of claim 26 wherein said event is a completion of storage of a predetermined block of data in said random access memory.

28. The method of claim 27 wherein said flash memory array comprises a plurality of sectors, at least one of said plurality of sectors having a data storage capacity.

29. The method of claim 28 wherein said amount of data of said predetermined block of data is less than said data storage capacity of said at least one of said plurality of sectors.

30. The method of claim 28 wherein an amount of data of said predetermined block of data exceeds said data storage capacity of said at least one of said plurality of sectors.

31. The method of claim 30 wherein said transferring step transfers, from said random access memory to said flash memory, a portion of said predetermined block of data equal to said data storage capacity of said at least one of said plurality of sectors.

32. The method of claim 28:
wherein a plurality of said predetermined blocks of data corresponding to a plurality of storage events are stored in said random access memory; and
wherein said transferring step transfers, from said random access memory to said flash memory, said plurality of said predetermined blocks of data to said flash memory when an amount of said data of said plurality of predetermined blocks of data is at least said data capacity of said at least one of plurality of sectors.

33. The method of claim 24 wherein at least one of said receiving step, said transferring step and said outputting step is paused in response to said interrupt command from said external controller.

34. The method of claim 24 wherein at least one of said receiving step, said transferring step and said outputting step is aborted in response to said interrupt command from said external controller.

35. The method of claim 24 further comprising the step of issuing, in the event of a fault condition, a request for assistance in resolving said fault condition to said external controller.

36. The system of claim 11, wherein said operation of said implantable medical device is a transmission of information between said implantable medical device and an external device.

* * * * *